(12) United States Patent
Felix et al.

(10) Patent No.: US 11,681,213 B2
(45) Date of Patent: Jun. 20, 2023

(54) EUV PATTERN TRANSFER USING GRADED HARDMASK

(71) Applicant: International Business Machines Corporation, Armonk, NY (US)

(72) Inventors: Nelson Felix, Slingerlands, NY (US); Luciana Meli Thompson, Albany, NY (US); Ashim Dutta, Menands, NY (US); Ekmini A. De Silva, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 872 days.

(21) Appl. No.: 16/282,005

(22) Filed: Feb. 21, 2019

(65) Prior Publication Data
US 2020/0272045 A1 Aug. 27, 2020

(51) Int. Cl.
*G03F 7/075* (2006.01)
*G03F 1/22* (2012.01)
*H01L 21/308* (2006.01)

(52) U.S. Cl.
CPC ............. *G03F 1/22* (2013.01); *G03F 7/0757* (2013.01); *H01L 21/3081* (2013.01)

(58) Field of Classification Search
CPC . G03F 7/091; G03F 7/092; G03F 7/11; G03F 7/0752; G03F 7/405
See application file for complete search history.

(56) References Cited

U.S. PATENT DOCUMENTS

| | | | |
|---|---|---|---|
| 6,429,538 B1 | 8/2002 | Lin | |
| 7,037,994 B2 | 5/2006 | Sugita et al. | |
| 7,244,549 B2 | 7/2007 | Iwasawa et al. | |
| 7,303,855 B2 | 12/2007 | Hatakeyama et al. | |
| 7,335,980 B2 | 2/2008 | Nguyen et al. | |
| 7,358,025 B2 | 4/2008 | Hatakeyama | |
| 7,485,582 B2 | 2/2009 | Nguyen et al. | |
| 8,652,762 B2 | 2/2014 | Goldfarb et al. | |
| 8,927,442 B1 | 1/2015 | Angyal et al. | |
| 9,634,039 B2 | 4/2017 | Choi et al. | |
| 2002/0160274 A1* | 10/2002 | Buxbaum | G03F 7/40 430/327 |

(Continued)

OTHER PUBLICATIONS

Tiwari et al., "Characterization of the Descum Process for Various Silicon Substrates," Abstract #2123, 224th ECS Meeting Oct./Nov. 2013 (1 page).

(Continued)

*Primary Examiner* — Daborah Chacko-Davis
(74) *Attorney, Agent, or Firm* — Joseph P. Curcuru; Michael J. Chang, LLC (57) ABSTRACT

Techniques for EUV resist pattern transfer using a graded hardmask are provided. In one aspect, a method of patterning is provided. The method includes: forming a graded hardmask on a device stack; depositing a resist onto the graded hardmask; patterning the resist to form a pattern in the resist having at least one feature; modifying at least one surface region to increase an etch rate of the graded hardmask; transferring the pattern from the resist to the graded hardmask; and transferring the pattern from the graded hardmask to at least one underlying layer of the device stack. A device structure formed by the patterning method is also provided.

19 Claims, 4 Drawing Sheets

(56) References Cited

U.S. PATENT DOCUMENTS

| | | | |
|---|---|---|---|
| 2009/0274974 A1* | 11/2009 | Abdallah | G03F 7/0752 |
| | | | 430/270.1 |
| 2012/0028472 A1* | 2/2012 | Radwan | H01L 22/20 |
| | | | 438/689 |
| 2012/0208124 A1 | 8/2012 | Iwashita et al. | |
| 2018/0240664 A9 | 8/2018 | Varadarajan et al. | |
| 2019/0391481 A1* | 12/2019 | Xu | G03F 1/80 |

OTHER PUBLICATIONS

Babich et al., "A Novel Graded Antireflective Coating with Built-in Hardmask Properties Enabling 65nm and Below CMOS Device Patterning," IEEE International Electron Devices Meeting Dec. 2003 (4 pages).

Shamiryan et al., "Comparative study of SiOCH low-k films with varied porosity interacting with etching and cleaning plasma," J. Vac. Sci. Technol. B 20(5), pp. 1923-1928 (Sep./Oct. 2002).

Palacios-Huerta et al., "Structural and optical properties of silicon rich oxide films in graded-stoichiometric multilayers for optoelectronic devices," Appl. Phys. Lett. 109(3), 031906 (Jul. 2016) (6 pages).

Noemaun et al., "Inductively coupled plasma etching of graded-refractive-index layers of TiO2 and SiO2 using an ITO hard mask," Journal of Vacuum Science & Technology A: Vacuum, Surfaces, and Films 29(5), 051302 (Sep./Oct. 2011) (7 pages).

* cited by examiner

EUV PATTERN TRANSFER USING GRADED HARDMASK

FIELD OF THE INVENTION

The present invention relates to extreme ultraviolet (EUV) pattern transfer, and more particularly, to EUV resist pattern transfer using a graded hardmask.

BACKGROUND OF THE INVENTION

Pattern transfer using EUV resist is very challenging due to stochastic defects and aspect ratio control. When patterning in the sub 40 nanometer (nm) pitch scale, resist thickness budget that remains for pattern transfer is very low. During pattern transfer, resist residue can be removed using an oxygen ($O_2$)-based plasma process (there are also other methods such $HBr/O_2$, $CO_2/CH_4$, $CF_4$ based). See, for example, Tiwari et al., "Characterization of the Descum Process for Various Silicon Substrates," Abstract #2123, 224th ECS Meeting October/November 2013 (1 page) (hereinafter "Tiwari"), the contents of which are incorporated by reference as if fully set forth herein. However, resist thickness loss during residue removal and pattern transfer exacerbates the existing local thinning of resist lines increasing the risk of nanobridges and line breaks, especially at a reduced pitch scale. Line bridging is caused by resist residue, whereas line breaks occur due to local thinning of resist.

Use of a highly selective hardmask etch helps dealing with resist budget and local resist thinning. However, this only reinforces defects like bridges and line breaks.

Therefore, improved EUV resist pattern transfer techniques would be desirable.

SUMMARY OF THE INVENTION

The present invention provides techniques for extreme ultraviolet (EUV) resist pattern transfer using a graded hardmask. In one aspect of the invention, a method of patterning is provided. The method includes: forming a graded hardmask on a device stack; depositing a resist onto the graded hardmask; patterning the resist to form a pattern in the resist having at least one feature; modifying at least one surface region to increase an etch rate of the graded hardmask; transferring the pattern from the resist to the graded hardmask; and transferring the pattern from the graded hardmask to at least one underlying layer of the device stack.

In another aspect of the invention, another method of patterning is provided. The method includes: forming a graded hardmask on a device stack, wherein the graded hardmask includes a carbon-containing material, and wherein a carbon content of the graded hardmask gradually decreases along a gradient from a top to a bottom of the graded hardmask; depositing a resist onto the graded hardmask; patterning the resist to form a pattern in the resist having at least one feature; removing resist residue from the patterning using an oxygen ($O_2$)-based plasma process that modifies at least one surface region of the graded hardmask exposed within the at least one feature to modify the at least one surface region to increase an etch rate of the graded hardmask; transferring the pattern from the resist to the graded hardmask; and transferring the pattern from the graded hardmask to at least one underlying layer of the device stack.

A more complete understanding of the present invention, as well as further features and advantages of the present invention, will be obtained by reference to the following detailed description and drawings.

DETAILED DESCRIPTION OF PREFERRED EMBODIMENTS

Provided herein are improved techniques for extreme ultraviolet (EUV) resist pattern transfer that employ a graded hardmask. For instance, as will be described in detail below, the hardmask is formed from a carbon-containing material such as silicon oxycarbide (SiOC), silicon carbide (SiC) and/or silicon carbonitride (SiCN) having a carbon (C) composition gradient with more carbon at the top of the hardmask film. The carbon content of the hardmask film gradually decreases towards the bottom of the film.

As will be described in detail below, use of the present graded hardmask allows for an oxygen ($O_2$)-based process for resist residue removal which also partially modifies and/or removes the hardmask such that a subsequent etch step can etch the hardmask without consuming too much of the resist. Advantageously, this approach allows for more overetch during the resist residue removal process since it also modifies the hardmask in a way that the subsequent hardmask etch will be more selective to the resist.

Figure 1:
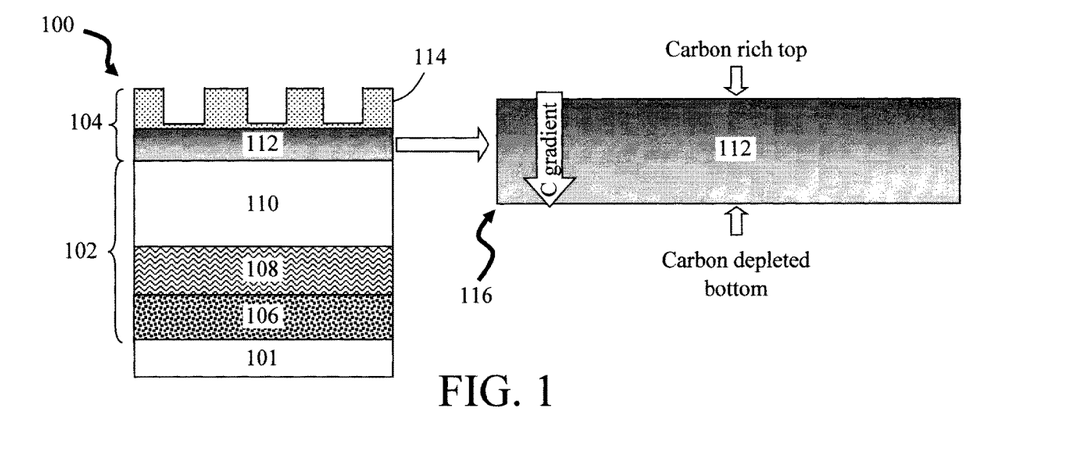
FIG. 1 is a cross-sectional diagram illustrating a semiconductor device structure having a multilayer device stack and extreme ultraviolet (EUV) lithography stack having a carbon-containing graded hardmask with a carbon gradient and EUV resist formed on a wafer according to an embodiment of the present invention.

Referring to FIG. 1, for example, a semiconductor device structure 100 is shown having a multilayer device stack 102 and EUV lithography stack 104 formed on a wafer 101. It is notable that the various structures depicted in the figures are not necessarily drawn to scale.

According to an exemplary embodiment, wafer 101 is a bulk semiconductor wafer, such as a bulk silicon (Si), bulk germanium (Ge), bulk silicon germanium (SiGe) and/or bulk III-V semiconductor wafer. Alternatively, wafer 101 can be a semiconductor-on-insulator (SOI) wafer. A SOI wafer includes a SOI layer separated from an underlying substrate by a buried insulator. When the buried insulator is an oxide it is referred to herein as a buried oxide or BOX. The SOI layer can include any suitable semiconductor, such as Si, Ge, SiGe, and/or a III-V semiconductor.

Device stack 102 disposed on wafer 101 can be composed of a variety of different layers, the contents of which can depend on the particular application. Ultimately, however, the pattern from the EUV lithography stack 104 will be transferred to one or more of the underlying layers in device stack 102. According to one non-limiting example, device stack 102 includes a nitride layer 106, an oxide layer 108 disposed on the nitride layer 106, and an organic planarizing layer (OPL) 110 disposed on the oxide layer 108.

Suitable materials for the nitride layer 106 include, but are not limited to, silicon nitride (SiN), silicon oxycarbonitride (SiOCN) and/or metal nitrides such as titanium nitride (TiN). Nitride layer 106 can be deposited onto the wafer 101 using a process such as chemical vapor deposition (CVD), physical vapor deposition (PVD) or atomic layer deposition (ALD). According to an exemplary embodiment, the nitride layer 106 is deposited to a thickness of from about 20 nanometers (nm) to about 26 nm and ranges therebetween, e.g., about 23 nm.

Suitable materials for the oxide layer 108 include, but are not limited to, silicon dioxide ($SiO_2$) and/or a $SiO_2$ precursor such as tetraorthosilicate (TEOS) ($Si(OC_2H_5)_4$). Oxide layer 108 can be deposited onto nitride layer 106 using a process such as CVD, PVD or ALD. According to an exemplary embodiment, the oxide layer 108 include is deposited to a thickness of from about 22 nm to about 28 nm and ranges therebetween, e.g., about 25 nm.

According to an exemplary embodiment, OPL 110 contains an aromatic cross-linkable polymer (e.g., naphthalene-based) in a solvent. Other suitable materials for use in OPL 110 include but are not limited to those materials described in U.S. Pat. No. 7,037,994 issued to Sugita et al. entitled "Acenaphthylene Derivative, Polymer, and Antireflection Film-Forming Composition," U.S. Pat. No. 7,244,549 issued to Iwasawa et al. entitled "Pattern Forming Method and Bilayer Film," U.S. Pat. No. 7,303,855 issued to Hatakeyama et al. entitled "Photoresist Undercoat-Forming Material and Patterning Process" and U.S. Pat. No. 7,358, 025 issued to Hatakeyama entitled "Photoresist Undercoat-Forming Material and Patterning Process." The contents of each of the foregoing patents are incorporated by reference herein. OPL 110 can be deposited onto the oxide layer 108 using a casting process such as spin-coating or spray coating. Following deposition, a post-apply bake is performed to cross-link the OPL 110 and bake off the solvent. By way of example only, the post-apply bake can be conducted at a temperature of up to about 250 degrees Celsius (° C.), e.g., from about 200° C. to about 250° C. and ranges therebetween. According to an exemplary embodiment, OPL 110 is formed having a thickness of from about 40 nm to about 80 nm and ranges therebetween, e.g., about 60 nm.

EUV lithography stack 104 includes a graded hardmask 112 disposed on the device stack 102 (i.e., on OPL 110), and an EUV resist 114 disposed on the hardmask 112. As provided above, hardmask 112 is formed from a carbon-containing material such as SiOC, SiC and/or SiCN. Referring to magnified view 116 of hardmask 112, the carbon (C) content in hardmask 112 gradually decreases along a gradient moving from the top to the bottom of hardmask 112. Namely, as shown in magnified view 116, hardmask 112 is carbon rich at the top and carbon depleted at the bottom.

By way of example only, the top of hardmask 112 contains from about 4 percent (%) to about 25% carbon and ranges therebetween, whereas the bottom of hardmask 112 contains from about 0% to about 1% carbon and ranges therebetween. Regions of the hardmask 112 in between the top and the bottom have a carbon content in between these top and bottom ranges. Further, the carbon content gradually decreases as a function of depth in the hardmask 112 film. For instance, according to an exemplary embodiment, the carbon content decreases by from about 1% to about 2% and ranges therebetween every from about 1 nm to about 2 nm and ranges therebetween from the top to the bottom of the hardmask 112. Thus, using a simple, non-limiting example to illustrate this concept, the carbon content at the top of the film might be 20%. At a depth of 2 nm into the hardmask 112 film the carbon content might drop to 18%, at a depth of 4 nm into the hardmask 112 film the carbon content might drop to 16%, and so on.

Notably, the gradient is gradual and hardmask 112 is made up of a single layer containing a gradient of the carbon as opposed, for example, to multiple layers of different materials. Further, as will be described in detail below, surface regions of the hardmask 112 will be modified to increase porosity and thus an etch rate through the hardmask, which increases the (hardmask-to-resist) etch selectivity. Thus, during the hardmask open, the amount of resist that is consumed is minimized. Accordingly, unwanted artifacts such as bridging and line breaks can be largely avoided to maintain the integrity of the pattern in the EUV resist 114. According to an exemplary embodiment, hardmask 112 is formed having a thickness of from about 5 nm to about 15 nm and ranges therebetween.

By way of example only, hardmask 112 having a carbon gradient can be deposited onto the device stack 102 using a controlled CVD, ALD or PVD-based process. See, for example, U.S. Pat. No. 6,429,538 issued to Lin, entitled "Method for Making a Novel Graded Silicon Nitride/Silicon Oxide (SNO) Hard Mask for Improved Deep Sub-Micrometer Semiconductor Processing" (a graded composite created using LPCVD and controlling the reactant gases) and Babich et al., "A Novel Graded Antireflective Coating with Built-in Hardmask Properties Enabling 65 nm and Below CMOS Device Patterning," IEEE International Electron Devices Meeting December 2003 (4 pages) (Si:C:O:H materials prepared by PECVD), the contents of both of which are incorporated by reference as if fully set forth herein. By way of example only, precursors for the present carbon-containing hardmask materials such as SiOC, SiC and/or SiCN include, but are not limited to Bistrimethylsilylmethane (BTMSM) and/or trimethylcyclote-trasiloxane (TMCTS).

Any commercially available EUV resist materials may be employed as EUV resist 114. See, for example, metal oxide EUV resists available from Inpria™, Corvallis, Oreg. Other suitable EUV resist materials are described, for example, in U.S. Patent Application Publication Number 2012/0208124 A1 by Iwashita et al., entitled "Resist Composition for EUV, Method for Producing Resist Composition for EUV, and Method of Forming Resist Pattern," the contents of which are incorporated by reference as if fully set forth herein. A casting process such as spin coating and/or spray coating can be employed to deposit EUV resist 114 onto the hardmask 112. According to an exemplary embodiment, EUV resist 114 is deposited to a thickness of from about 5 nm to about 10 nm and ranges therebetween.

As will be described in detail below, a graded hardmask 112 (e.g., SiOC, SiC and/or SiCN) with more carbon at the top of the hardmask film allows an $O_2$-based residue removal process to modify the top layer of hardmask 112. The modified hardmask 112 can then be etched relatively easily using etch chemistry that is selective to EUV resist 114, thereby preserving more of the EUV resist 114 and thus preventing unwanted occurrences such as line breaks.

The advantages of the present graded hardmask design are made further evident by reference to the exemplary methodology for EUV patterning shown illustrated in FIGS. 2-6. In FIGS. 2-6, the semiconductor device structure 100 of FIG. 1 is used as a non-limiting example, and like structures are numbered alike.

Namely, as provided above, semiconductor device structure 100 includes a multilayer device stack 102 and EUV lithography stack 104 formed on a (e.g., bulk semiconductor or SOI) wafer 101. In this example, the device stack 102 includes a nitride layer 106 (e.g., SiN, SiOCN and/or TiN), an oxide layer 108 (e.g., $SiO_2$ and/or a $SiO_2$ precursor such as TEOS) disposed on the nitride layer 106, and an OPL 110 disposed on the oxide layer 108. The EUV lithography stack 104 includes a graded hardmask 112 (e.g., SiOC, SiC and/or SiCN) disposed on the device stack 102, and an EUV resist 114 disposed on the hardmask 112. As provided above, the carbon (C) composition in hardmask 112 gradually decreases along a gradient moving from the top to the bottom of hardmask 112 such that the hardmask 112 is carbon rich at the top and carbon depleted at the bottom. For instance, according to an exemplary embodiment, the carbon content in hardmask 112 gradually decreases by from about 1% to about 2% and ranges therebetween every from about 1 nm to about 2 nm and ranges therebetween from the top of the hardmask 112.

Figure 2:
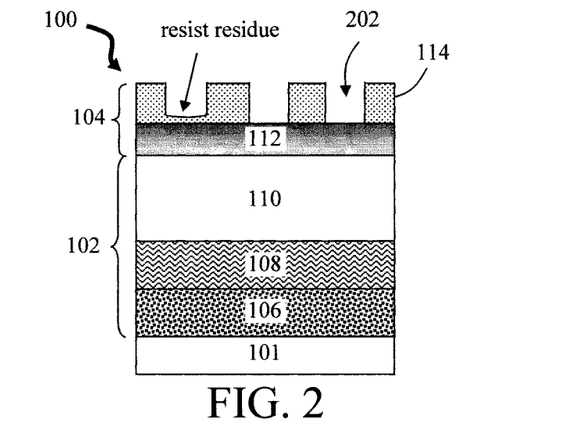
FIG. 2 is a cross-sectional diagram illustrating the EUV resist having been patterned to form a pattern in the EUV resist containing at least one feature, and how randomly formed residue can remain in the features after patterning according to an embodiment of the present invention.

As shown in FIG. 2, the process begins with the patterning of EUV resist 114 which involves forming a pattern containing at least one feature 202 (e.g., trenches) in EUV resist 114. Standard photolithography techniques can be employed to pattern the EUV resist 114.

Figure 3:
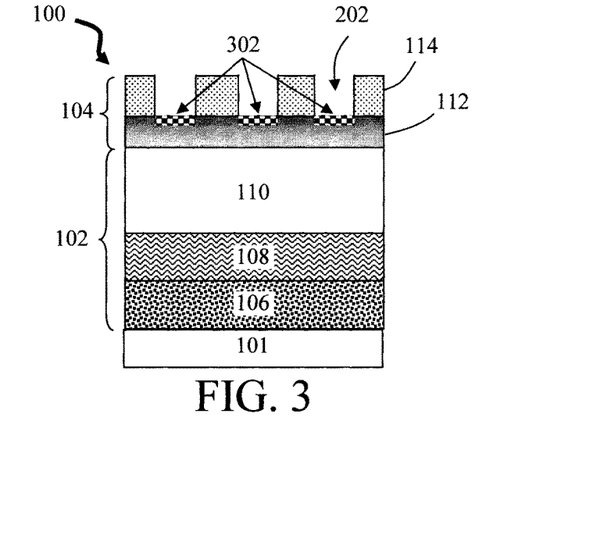
FIG. 3 is a cross-sectional diagram illustrating an oxygen ($O_2$)-based cleaning process having been performed to remove the residue which removes carbon from the surface of the hardmask and increases porosity according to an embodiment of the present invention.

Following patterning of the EUV resist 114, residue can remain in the features 202 and needs to be removed prior to pattern transfer to the hardmask 112. See FIG. 2. Namely, as shown in FIG. 3, a cleaning process is next performed to remove the residue. According to an exemplary embodiment, the cleaning process employed is an $O_2$-based plasma process (wherein $O_2$ is the reactive species). During an $O_2$-based plasma process, a few hundred angstroms of the EUV resist 114 is removed (see, e.g., Tiwari), including the residue.

Notably, exposure of (graded SiOC, SiC and/or SiCN) hardmask 112 to an $O_2$ plasma will remove carbon from the surface of hardmask 112, forming a porous $SiO_2$-like material. See, for example, Shamiryan et al., "Comparative study of SiOCH low-k films with varied porosity interacting with etching and cleaning plasma," J. Vac. Sci. Technol. B 20(5), pp. 1923-1928 (September/October 2002) (hereinafter "Shamiryan"), the contents of which are incorporated by reference as if fully set forth herein. As a result, the surface regions 302 of hardmask 112 exposed to the $O_2$ plasma within the features 202 are modified by the $O_2$ plasma. See FIG. 3. Namely, the surface regions 302 will have increased porosity. For instance, by way of example only, pre-exposure, the hardmask 112 has a porosity of from about 10% to about 30% and ranges therebetween. Following exposure to the $O_2$ plasma, a porosity of the surface regions 302 increases to from about 20% to about 60% and ranges therebetween. Increasing the porosity increases the etch rate. See Shamiryan. Thus, increasing the porosity of surface regions 302 will increase the etch rate through the surface regions 302 thus increasing the overall etch rate through hardmask 112 during the hardmask open (see below). Advantageously, as highlighted above, increasing the etch rate through the hardmask 112 increases the hardmask-to-resist selectivity by decreasing the amount of EUV resist 114 that is consumed during the hardmask open.

Figure 4:
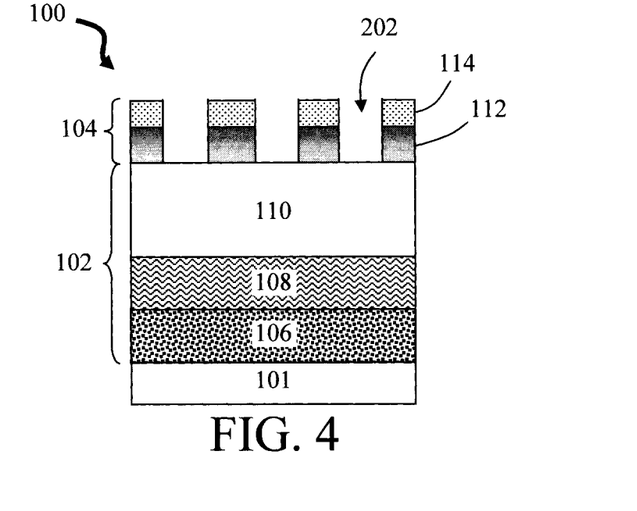
FIG. 4 is a cross-sectional diagram illustrating a hardmask open etch having been performed to transfer the pattern from the EUV resist to the hardmask using, e.g., a fluorine-based etch according to an embodiment of the present invention.

Namely, as shown in FIG. 4, a hardmask open etch is performed to transfer the pattern (including features 202) from the EUV resist 114 to (graded) hardmask 112. According to an exemplary embodiment, EUV with a fluorine-based chemistry is used for the hardmask open etch. By way of example only, suitable fluorine-based etches include, but are not limited to, octafluorocyclobutane ($C_4F_8$)/$O_2$ and/or tetrafluoromethane ($CF_4$)/difluoromethane ($CH_2F_2$). As provided above, the porosity of surface regions 302 of hardmask 112 is increased. An increased hardmask porosity provides more accessibility to the etch, thereby increasing the overall etch rate through the hardmask 112.

An increased etch rate through the hardmask 112 results in less of the EUV 114 being consumed during the hardmask open. This is advantageous because resist loss results in alterations to the pattern transferred to the hardmask 112. In extreme cases, bridges and/or line breaks can undesirably occur. For instance, when the resist is overly thinned, barriers between adjacent lines/features can disappear during pattern transfer.

Further, with fluorine-based etches the selectivity for hardmask 112 (over EUV resist 114) can actually increase as the carbon content in hardmask 112 tapers along the gradient. See, for example, FIG. 8—described below. Thus, during the hardmask open, the hardmask-to-resist selectivity can increase as the etch progresses through the hardmask 112 based on the gradual decrease in carbon content (along the gradient).

Figure 5:
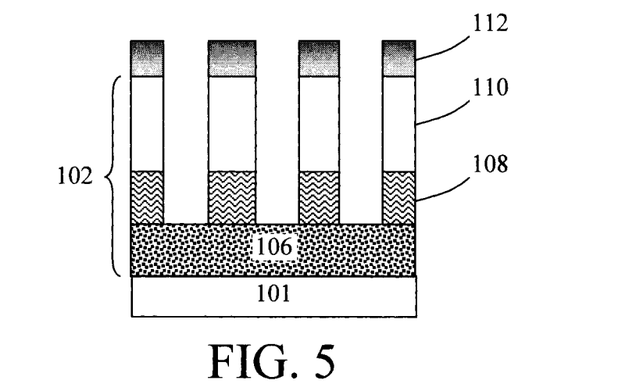
FIG. 5 is a cross-sectional diagram illustrating the pattern having been transferred from the hardmask to one or more of the underlying layers of device stack according to an embodiment of the present invention.

Following the hardmask 112 open, the remaining EUV resist 114 is removed and, as shown in FIG. 5, the pattern is transferred from the (now-patterned) hardmask 112 to one or more of the underlying layers of device stack 102. For instance, by way of example only, the pattern form hardmask 112 is transferred to OPL 110 and oxide layer 108.

Figure 6:
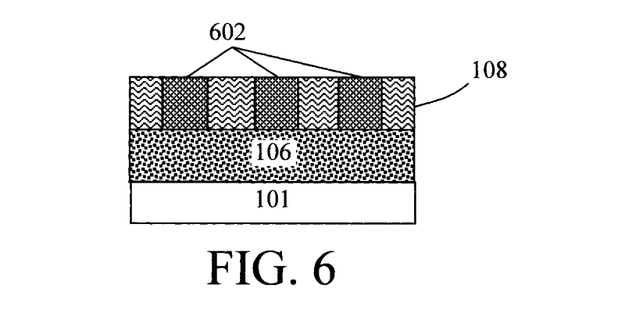
FIG. 6 is a cross-sectional diagram illustrating, according to one exemplary implementation, the pattern having been filled with a contact metal according to an embodiment of the present invention.

The present techniques can be employed for a variety of different lithographic processes and applications. For instance, according to an exemplary embodiment, the present techniques are employed to form metal lines on the wafer 101. See, for example, FIG. 6. As shown in FIG. 6, following pattern transfer from the hardmask 112, the OPL 110 is removed. The pattern in oxide layer 108 is then filled with a contact metal 602 such as cobalt (Co), ruthenium (Ru), nickel (Ni) platinum (Pt), palladium (Pd), copper (Cu), etc. Again, what is shown in FIG. 6 is merely an example, and the present techniques should not be construed as being limited to any application in particular.

Figure 7:
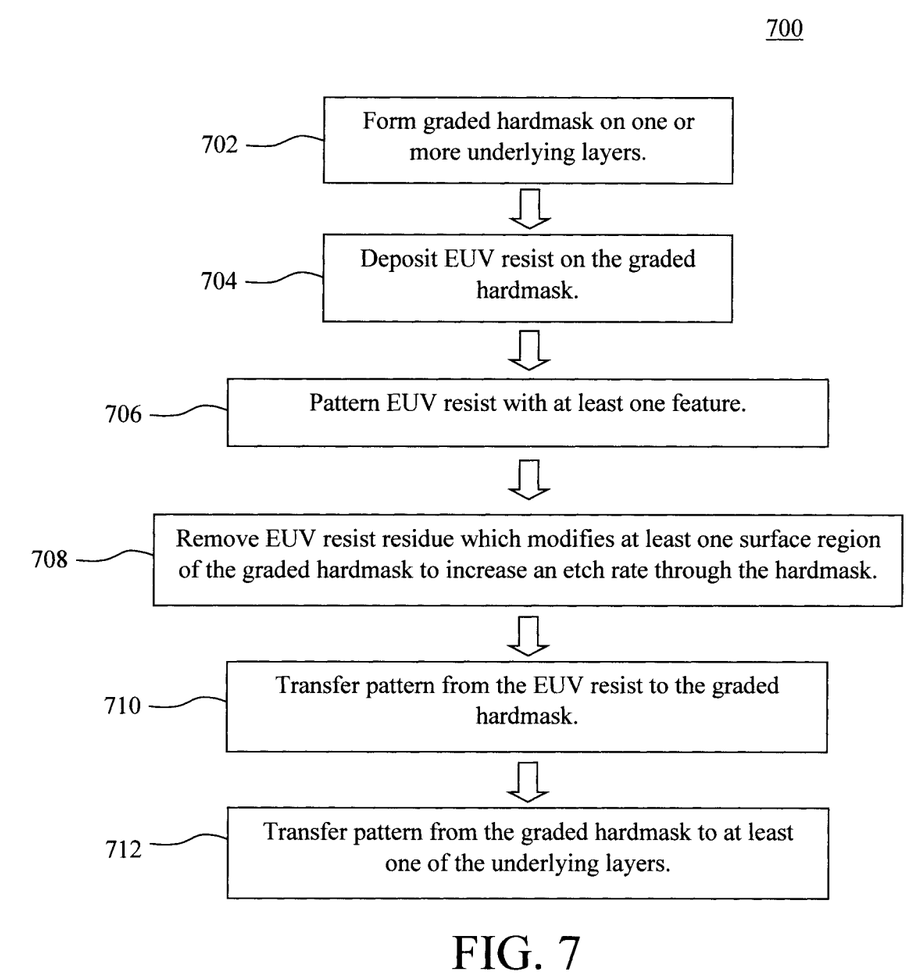
FIG. 7 is a diagram illustrating an exemplary methodology for patterning using the present graded hardmask according to an embodiment of the present invention.

Given the above description, an overview of the present patterning techniques using EUV lithography with a graded hardmask are summarized in methodology 700 of FIG. 7. In step 702, a graded hardmask 112 is formed on a device stack 102 (e.g., nitride layer 106/oxide layer 108/OPL 110) disposed on the oxide layer 108. As provided above, according to an exemplary embodiment the graded hardmask 112 is formed from a carbon-containing material such as SiOC, SiC and/or SiCN, and the carbon content of the graded hardmask 112 gradually decreases along a gradient from the top to the bottom of the graded hardmask 112.

In step 704, an EUV resist 114 is deposited onto the graded hardmask. In step 706, the EUV resist 114 is patterned to form a pattern in the EUV resist 114 having at least one feature 202 (e.g., trench).

In step 708, EUV resist 114 residue from the patterning is removed. As provided above, according to an exemplary embodiment, the resist residue is removed using an $O_2$-based plasma process, wherein the $O_2$-based plasma process modifies at least one surface region of the graded hardmask 112 exposed within the at least one feature to remove carbon from the at least one surface region of the graded hardmask 112 and thereby change a porosity of the graded hardmask 112 in the at least one surface region (i.e., to increase an etch rate of the graded hardmask 112).

In step 710, the pattern is transferred from the EUV resist 114 to the graded hardmask 112 using EUV lithography with, e.g., fluorine-based etch chemistry such as $C_4F_8/O_2$ and/or $CF_4/CH_2F_2$. In step 712, the pattern from the graded hardmask 112 is transferred to at least one underlying layer of the device stack 102.

Figure 8:
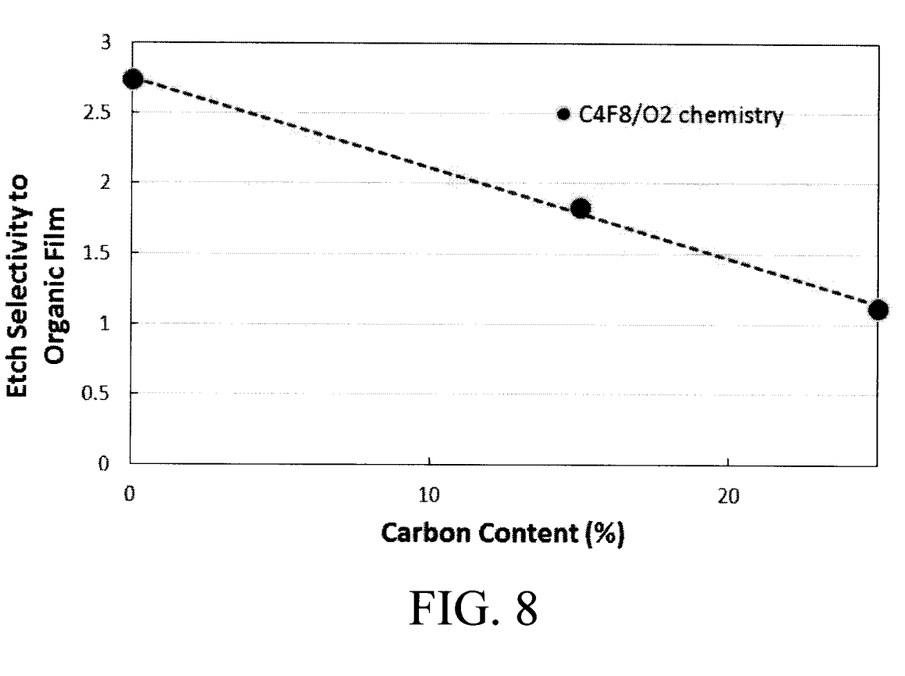
FIG. 8 is a diagram illustrating how etch selectivity for the graded hardmask can increase as the carbon content in hardmask tapers along the gradient according to an embodiment of the present invention.

As highlighted above, the etch selectivity for hardmask 112 (over EUV resist 114) can increase as the carbon content in hardmask 112 tapers along the gradient. See, for example, FIG. 8. FIG. 8 is a diagram illustrating the etch selectivity of hardmask 112 to an organic film (i.e., a typical EUV resist material) as a function of carbon content. In this example, a fluorine-based etch chemistry $C_4F_8/O_2$ was evaluated. As described in detail above, the present graded hardmask design includes a carbon gradient that gradually decreases moving from the top to the bottom of the hardmask film such that the hardmask is carbon rich at the top and carbon depleted at the bottom. In this example, SiOC hardmask samples with carbon content ranging from 0% to 25% were tested. As shown in FIG. 8, the selectivity of the $C_4F_8/O_2$ etch for the SiOC hardmask (over EUV resist materials) increases with a decrease in the carbon content. Thus, during the hardmask open, the hardmask-to-resist selectivity is enhanced the farther the etch progresses through the hardmask 112 based on the gradual decrease in carbon content along the gradient.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of patterning, comprising the steps of:
   forming a graded hardmask directly on a device stack, wherein the graded hardmask comprises a carbon-containing material, and wherein the graded hardmask is made up of a single layer containing a gradient of carbon;
   depositing a resist directly onto the graded hardmask;
   patterning the resist to form a pattern in the resist comprising at least one feature;
   modifying at least one surface region of the graded hardmask to increase an etch rate of the graded hardmask;
   transferring the pattern from the resist to the graded hardmask; and
   transferring the pattern from the graded hardmask to at least one underlying layer of the device stack.

2. The method of claim 1, wherein the carbon-containing material is selected from the group consisting of: silicon carbide (SiC), silicon oxycarbide (SiOC), silicon carbonitride (SiCN), and combinations thereof.

3. The method of claim 1, wherein a carbon content of the graded hardmask gradually decreases along the gradient from a top to a bottom of the graded hardmask.

4. The method of claim 3, wherein the top of the graded hardmask comprises from about 4% to about 25% carbon and ranges therebetween, and wherein the bottom of the graded hardmask comprises from about 0% to about 1% carbon and ranges therebetween.

5. The method of claim 3, wherein the carbon content decreases by from about 1% to about 2% and ranges therebetween every from about 1 nm to about 2 nm and ranges therebetween from the top to the bottom of the graded hardmask.

6. The method of claim 1, wherein the graded hardmask has a thickness of from about 5 nm to about 15 nm and ranges therebetween.

7. The method of claim 1, further comprising the step of:
   removing resist residue from the patterning.

8. The method of claim 7, wherein the resist residue is removed using an oxygen ($O_2$)-based plasma process, wherein the $O_2$-based plasma process modifies the at least one surface region of the graded hardmask exposed within the at least one feature to remove carbon and change a porosity of the graded hardmask in the at least one surface region.

9. The method of claim 1, wherein the pattern is transferred from the resist to the graded hardmask using extreme ultraviolet (EUV) lithography with a fluorine-based etch chemistry.

10. The method of claim 9, wherein the fluorine-based etch chemistry is selected from the group consisting of: octafluorocyclobutane ($C_4F_8$)/$O_2$, tetrafluoromethane ($CF_4$)/ difluoromethane ($CH_2F_2$) and combinations thereof.

11. The method of claim 1, wherein the device stack comprises:
    a nitride layer;
    an oxide layer disposed on the nitride layer; and
    an organic planarizing layer (OPL) disposed on the oxide layer, wherein the graded hardmask is formed on the OPL.

12. The method of claim 11, wherein the nitride layer comprises a material selected from the group consisting of: silicon nitride (SiN), silicon oxycarbonitride (SiOCN), a metal nitride, titanium nitride (TiN) and combinations thereof.

13. The method of claim 11, wherein the oxide layer comprises a material selected from the group consisting of: silicon dioxide ($SiO_2$), tetraorthosilicate (TEOS), and combinations thereof.

14. A method of patterning, comprising the steps of:
    forming a graded hardmask directly on a device stack, wherein the graded hardmask comprises a carbon-containing material, wherein the graded hardmask is made up of a single layer containing a gradient of carbon, and wherein a carbon content of the graded hardmask gradually decreases along the gradient from a top to a bottom of the graded hardmask;
    depositing a resist directly onto the graded hardmask;
    patterning the resist to form a pattern in the resist comprising at least one feature;
    removing resist residue from the patterning using an $O_2$-based plasma process that modifies at least one surface region of the graded hardmask exposed within the at least one feature to modify the at least one surface region to increase an etch rate of the graded hardmask;
    transferring the pattern from the resist to the graded hardmask; and transferring the pattern from the graded hardmask to at least one underlying layer of the device stack.

15. The method of claim 14, wherein the carbon-containing material is selected from the group consisting of: SiC, SiOC, SiCN, and combinations thereof.

16. The method of claim 14, wherein the top of the graded hardmask comprises from about 4% to about 25% carbon and ranges therebetween, wherein the bottom of the graded hardmask comprises from about 0% to about 1% carbon and ranges therebetween, and wherein the carbon content decreases by from about 1% to about 2% and ranges therebetween every from about 1 nm to about 2 nm and ranges therebetween from the top to the bottom of the graded hardmask.

17. The method of claim 14, wherein the pattern is transferred from the resist to the graded hardmask using EUV lithography with a fluorine-based etch chemistry selected from the group consisting of: $C_4F_8/O_2$, $CF_4/CH_2F_2$, and combinations thereof.

18. A device structure, formed by a patterning method comprising the steps of:

forming a graded hardmask directly on a device stack, wherein the graded hardmask comprises a carbon-containing material, wherein the graded hardmask is made up of a single layer containing a gradient of carbon, and wherein a carbon content of the graded hardmask gradually decreases along the gradient from a top to a bottom of the graded hardmask;

depositing a resist directly onto the graded hardmask;

patterning the resist to form a pattern in the resist comprising at least one feature;

modifying at least one surface region of the graded hardmask to increase an etch rate of the graded hardmask;

transferring the pattern from the resist to the graded hardmask; and transferring the pattern from the graded hardmask to at least one underlying layer of the device stack.

19. The device structure of claim 18, wherein the carbon-containing material is selected from the group consisting of: SiC, SiOC, SiCN, and combinations thereof.

* * * * *